United States Patent [19]
Woolaway

[11] Patent Number: 5,602,511
[45] Date of Patent: Feb. 11, 1997

[54] CAPACITIVE TRANSIMPEDANCE AMPLIFIER HAVING DYNAMIC COMPRESSION

[75] Inventor: James T. Woolaway, Goleta, Calif.

[73] Assignee: Santa Barbara Research Center, Goleta, Calif.

[21] Appl. No.: 486,492

[22] Filed: Jun. 7, 1995

[51] Int. Cl.$^6$ .................................................. H03F 3/08
[52] U.S. Cl. ........................... 330/282; 330/308; 330/86
[58] Field of Search .................. 330/51, 86, 110, 330/282, 308; 250/214 A

[56] References Cited

U.S. PATENT DOCUMENTS

| | | | |
|---|---|---|---|
| 4,786,831 | 11/1988 | Morse et al. | 307/490 |
| 5,198,660 | 3/1993 | Yokoyama et al. | 250/214 A |
| 5,363,055 | 11/1994 | Ribner | 330/51 X |

FOREIGN PATENT DOCUMENTS 0297910  12/1989  Japan ........................................ 330/308

Primary Examiner—Steven J. Mottola
Attorney, Agent, or Firm—W. C. Schubert; W. K. Denson-Low

[57] ABSTRACT

A Compressing Capacitively Coupled Transimpedance Amplifier (CCTIA) circuit (10) has an amplifier (AMP) with a variable capacitance feedback network (C1, C2, C3, Q1, Q2) coupled between a current receiving amplifier input node and an amplifier output node. The output node outputs a voltage in response to a received current. The variable capacitance feedback network is responsive to the output voltage for establishing one of a plurality of different transimpedance values for the circuit such that the circuit exhibits a greatest transimpedance value for an input current having a magnitude below a threshold magnitude, and a lesser transimpedance value for an input current having a magnitude equal to or above the threshold magnitude.

3 Claims, 5 Drawing Sheets

CAPACITIVE TRANSIMPEDANCE AMPLIFIER HAVING DYNAMIC COMPRESSION

FIELD OF THE INVENTION

This invention relates generally to circuits that integrate and amplify electrical signals and, in particular, to a class of such circuits that are known as Capacitive Transimpedance Amplifiers (CTIA) that convert an input current to a voltage.

BACKGROUND OF THE INVENTION

Many radiation detectors, such as a Focal Plane Array (FPA) of infra-red (IR) radiation detectors, output a current that must be amplified prior to signal processing. The Capacitive Transimpedance Amplifier (CTIA) is one conventional circuit that is often used for this purpose. By example, reference can be had to U.S. Pat. No. 4,786,831, entitled "Integrating Capacitively Coupled Transimpedance Amplifier", by Arthur L. Morse, Steven D. Gaalema, Ingrid M. Keimel, and Mary J. Hewitt, the disclosure of which is incorporated by reference herein in its entirety.

FIG. 1 illustrates a conventional CTIA configuration. A capacitor (C1) and a reset switch (SW) are connected in the feedback path of a high gain inverting amplifier (AMP) that provides charge buffering for an input current. The input current acts to debias the input of the CTIA. The amplifier drives the output node as a function of the input debias multiplied by the amplifier gain. This causes charge to be transferred from the input node to the capacitor C1.

In most such charge integration and charge amplification applications any noise that is present in the input charge signal is proportional to the square root of the input charge signal. The signal-to-noise ratio is therefore the least at the smallest input signal levels. However, linear charge integration and charge amplification circuits that are designed to accommodate the maximum input signal levels have difficulty in meeting the low noise requirements of the smallest input signals.

SUMMARY OF THE INVENTION

It is thus an object of this invention to provide a wide dynamic range CTIA that exhibits a highest gain at small input signal levels, thereby providing optimal noise performance, and a lowest gain at high input signal levels.

It is a further object of this invention to provide a CTIA that has at least one transimpedance break point, at a predetermined location in an integrated transimpedance curve, thereby enabling the CTIA to exhibit a high transimpedance at a small input signal level and a low transimpedance at a high input signal level.

The foregoing and other problems are overcome and the objects of this invention are realized by a CTIA that provides dynamic compression. Specifically, a Compressing CTIA (CCTIA) includes feedback circuitry that is responsive to a magnitude of a voltage output by the CCTIA for modifying the transimpedance transfer function in one or more discrete quantized steps, thereby providing a variable gain.

The teaching of this invention thus enables a high value of transimpedance to be exhibited for the smallest input signals, while larger input signals cause the CCTIA to exhibit a lower value of transimpedance. The CCTIA circuit topology provides for control over the number of transimpedance break points, the locations of the break points on the integrated transimpedance curve, and also provides control over the additive value of each transimpedance break point.

More particularly, this invention provides a CCTIA circuit having an amplifier with a variable capacitance feedback network coupled between a current receiving amplifier input node and an amplifier output node. The output node outputs a voltage in response to a received current. The variable capacitance feedback network is responsive to the output voltage for establishing one of a plurality of different transimpedance values for the circuit such that the circuit exhibits a greatest transimpedance value for an input current having a magnitude below a threshold magnitude, and a lesser transimpedance value for an input current having a magnitude equal to or above the threshold magnitude.

BRIEF DESCRIPTION OF THE DRAWINGS

The above set forth and other features of the invention are made more apparent in the ensuing Detailed Description of the Invention when read in conjunction with the attached Drawings, wherein:

FIGS. 5–9 depict simulation results for the integration of a laser pulse by the CCTIA, wherein FIG. 5 is graph illustrating the laser pulse and CCTIA reset signal timing; FIG. 6 is a graph illustrating a response of the CCTIA to a 0.1 microamp laser pulse; FIG. 7 is a graph illustrating a response of the CCTIA to a 1.0 microamp laser pulse; FIG. 8 is a graph illustrating a response of the CCTIA to a 10.0 microamp laser pulse; and FIG. 9 is a graph illustrating a response of the CCTIA to a 30.0 microamp laser pulse.

DETAILED DESCRIPTION OF THE INVENTION

Figure 1:
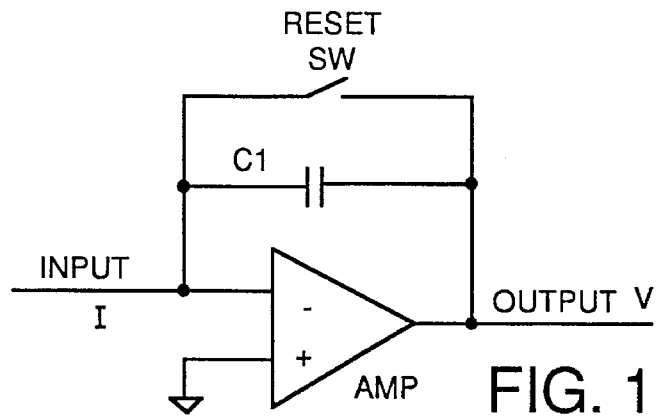
FIG. 1 is a simplified schematic diagram of a conventional CTIA.
Figure 2:
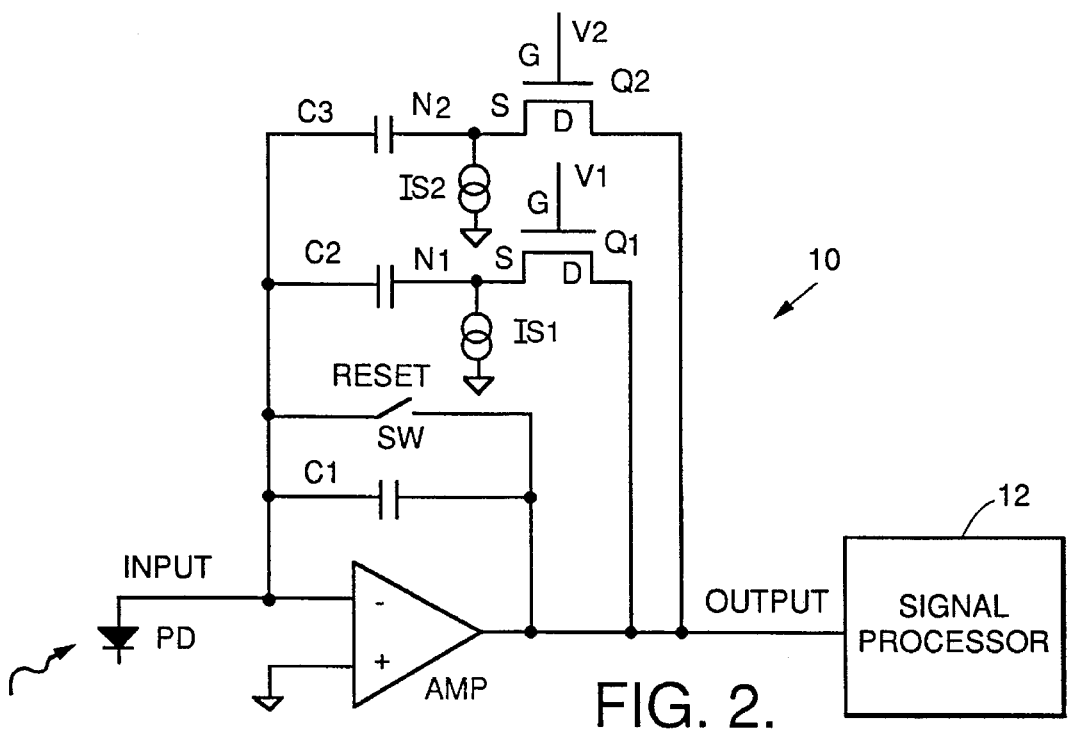
FIG. 2 is a simplified schematic diagram of a Compressing Capacitive Transimpedance Amplifier (CCTIA) in accordance with this invention.

The circuit topology for a CTIA with dynamic compression (CCTIA) 10 is illustrated in FIG. 2, wherein multiple parallel feedback paths are provided. The first feedback path is comprised of C1, which is reset via SW as in the conventional CTIA of FIG. 1. The value of C1 sets the highest transimpedance value for an inverting amplifier (AMP) for a current input from a current source, such as a photodetector (PD). An output voltage of the amplifier may be input to a signal processor 12, where desired signal processing occurs. By example only, the PD can be used to detect laser energy, and the signal processor 12 can then be used to monitor the output signal to determine if laser energy above a certain threshold is present. That is, the illustrated configuration can be employed as a laser threat detection and warning system.

In accordance with the teaching of this invention, two additional feedback paths are connected between the input of the amplifier and the output, and thus in parallel with C1 and the reset switch SW. A first additional feedback path is comprised of a MOSFET transistor Q1, a capacitance C2, and an optional current source IS1. A second additional feedback path is comprised of MOSFET transistor Q2, capacitance C3, and an optional current source IS2. Although two additional feedback paths are illustrated, the teaching of this invention applies equally to the use of one additional feedback path, and also to more than two additional feedback paths. The current sources IS1 and IS2 are employed when it is desired to increase the bandwidth and response time of the CCTIA 10.

MOSFETs Q1 and Q2 each have a source (S) terminal coupled to the respective capacitances C2 and C3, a drain (D) terminal coupled to the output of the amplifier AMP, and a gate (G) terminal coupled to an associated voltage potential V1 and V2. The magnitudes of V1 and V2, in combination with the surface potentials of Q1 and Q2, respectively, set the transimpedance break points of the CCTIA 10; that is, points in the output voltage signal waveform where the transimpedance of the amplifier changes by a discrete amount. To a first order the surface potential of Q1 and Q2 is one threshold (e.g., ~1.0 volt) below the gate potential set by V1 and V2. Thus, when the amplifier output potential becomes approximately equal to the surface potential of one of the MOSFETs Q1 or Q2 the amplifier output begins to drive the MOSFET source and the associated capacitance. This results in an incremental addition of capacitance in the feedback loop of the amplifier AMP as the amplifier output potential crosses each of the MOSFET surface potential break points, as established by V1 and V2.

In general, the transimpedance break points are established by setting V1 and V2 to predetermined potentials, and the transimpedances are established by selecting the values of C1, C2 and C3.

The optional current sources IS1 and IS2 are provided at the junction of each MOSFET source terminal and the respective feedback capacitor. The current sources IS1 and IS2 operate to stabilize the reset process for the CCTIA 10, as described in further detail below.

As an example of the operation of CCTIA 10, it is assumed that the output potential of the amplifier AMP is established at greater than approximately +5 volts during the time that the reset signal is active, and then approaches ground potential during the integration period. It is also assumed that V1 is a positive potential that is less than approximately +5 volts, and that V2 has a positive potential that is less than V1. During the reset period the input and output nodes of the amplifier AMP attempt to equilibrate. Also during the reset period the node N1 connected to the source of Q1 and IS1 rises to the gate potential V1 less approximately one threshold, and the node N2 connected to the source of Q2 and IS2 rises to the gate potential V2 less approximately one threshold. During the reset period Q1 and Q2 thus operate as source followers, and their drain terminals present a high impedance to the output of the amplifier AMP.

It is noted that without IS1 the capacitance C1 supplies current to drive the node N1 to the potential of V1, less the threshold. However, the time constant may be on the order of hundreds of microseconds, which may be significantly longer than the required reset period. To avoid this condition the current sources IS1 and IS2 are provided to source a sufficient amount of current to quickly slew the nodes N1 and N2, respectively, during the reset period.

After the reset period the amplifier AMP begins to integrate the input current with C1, and the output voltage of the amplifier begins to drop from greater than +5 V towards ground potential, thereby collapsing the drain potentials of Q1 and Q2. Initially the drains of Q1 and Q2 act as high impedance ports, and C2 and C3 are essentially disconnected from the AMP feedback path. However, as the output voltage of the amplifier AMP reaches the surface potential of Q1 (i.e., V1—~1.0 V) the drain of Q1 becomes a low impedance. At this time the source of Q1 begins to follow the drain potential, thereby effectively placing C2 in parallel with C1 and changing the transimpedance accordingly (the first transimpedance break point). Assuming that the magnitude of the input current is sufficiently large so that the output potential of the amplifier AMP also reaches the surface potential of Q2 during the integration period, the drain of Q2 also becomes a low impedance and the source of Q2 then begins to follow its drain potential, thereby effectively placing C3 in parallel with both C1 and C2. In this manner the transimpedance of the CCTIA 10 is automatically varied as a function of the output potential of the CCTIA.

Figure 3:
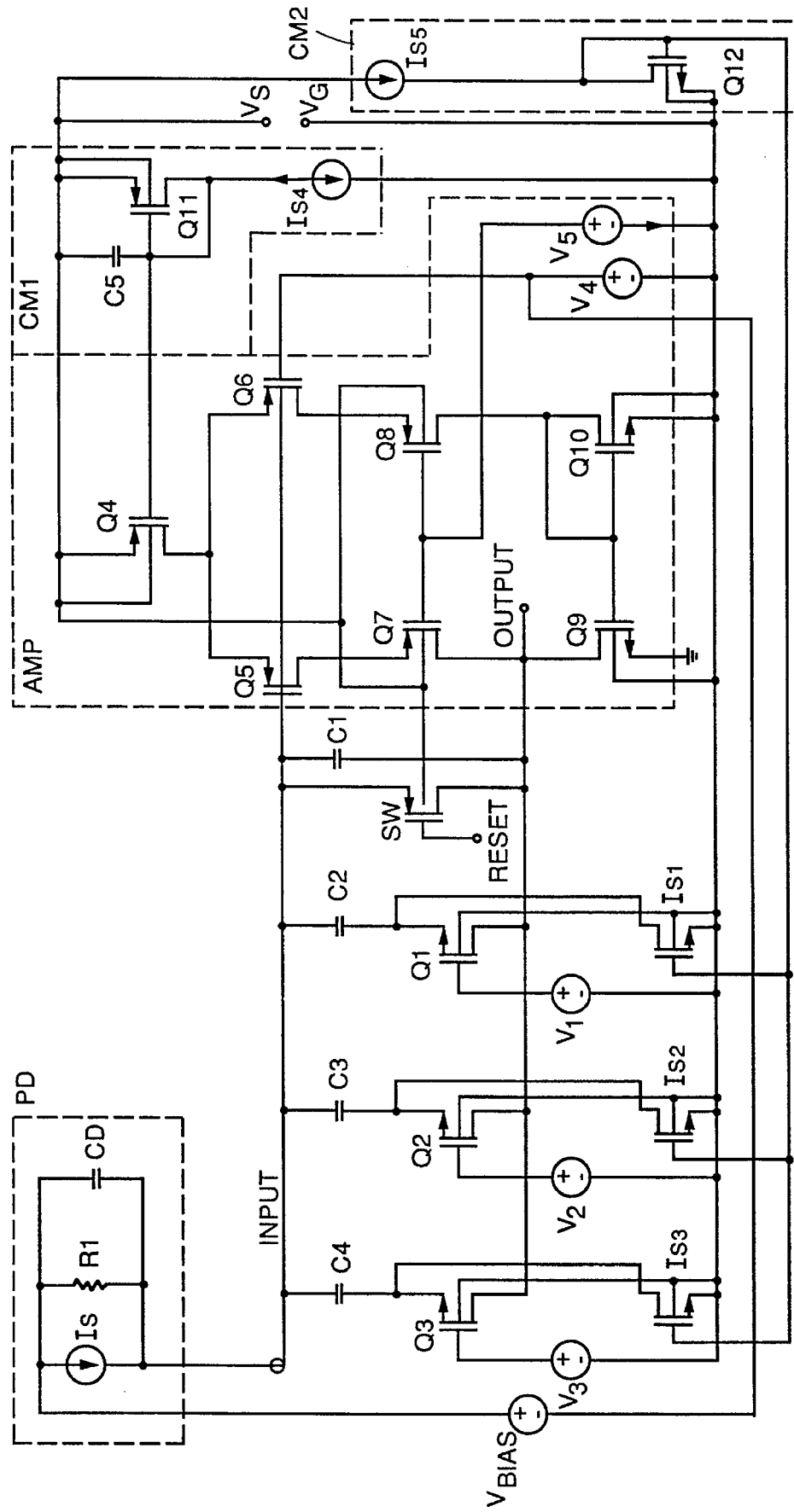
FIG. 3 is a detailed schematic diagram of the CCTIA of FIG. 2.

An illustrative embodiment of the Compressing Capacitive Transimpedance Amplifier 10 is shown in FIG. 3. In FIG. 3 a fourth feedback path is added to the three illustrated in FIG. 2. That is, the CCTIA 10 has four transimpedances designated C1–C4. By example, C1–C4 have values of 100 fF, 300 fF, 1 pF, and 3 pF, respectively, with transimpedance break points separated by 0.5 Volts. By example, V1 is equal to +5 V, V2 is equal to +4.5 V, and V3 is equal to +4.0 volts. A cascode CMOS amplifier (AMP) is comprised of transistors Q4–Q10 and a first current mirror CM1 comprised of C5, Q11 and IS4. The cascode configuration is preferably used so as to minimize the Miller capacitance of the input MOSFET Q5 gate-to-drain capacitance.

FIG. 3 also illustrates a photodetector PD equivalent circuit comprised of a current source IS in parallel with a resistance R1 and a capacitance CD. A photodetector bias potential is indicated by the voltage source $V_{BIAS}$.

Each parallel capacitive feedback path (C2–C4) includes an associated MOSFET (Q1–Q3) and a voltage source, indicated by V1–V3, that is coupled to the gate terminal of the associated MOSFET Q1–Q3. Current sources IS1–IS3 are connected to the respective source terminals of MOSFETs Q1–Q3 as described above with respect to FIG. 2. A second current mirror CM2 comprised of IS5 and Q12 is coupled to each of the current sources IS1–IS3. Supply voltages for the circuit are indicated by $V_S$ and $V_G$ and may be, by example, +7 V and ground. Voltage sources V4 and V5 are used for biasing the amplifier AMP.

Figure 4:
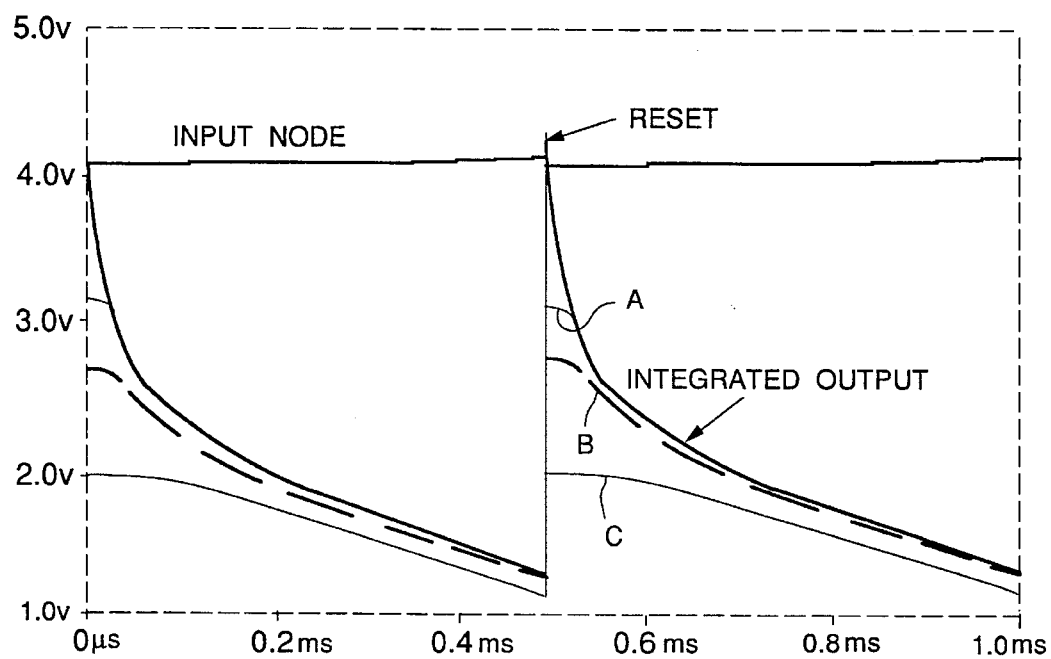
FIG. 4 is a graph illustrating a transfer function of the CCTIA of FIGS. 2 and 3, the graph making evident the transimpedance break points.

FIG. 4 shows the effects of the transimpedance break points during a transient integration. Here a 10 nA input current is integrated for 500 microseconds. The top-most curve is the circuit output which shows the integrated compression characteristics for the four transimpedance feedback paths of FIG. 3. Each of the lower curves (designated A–C) show the voltage signal at the additional feedback loops associated with C2–C4, respectively. The delay in the onset of these signals is a function of the crossover points for the circuit output voltage, and the surface potentials of the MOSFETs Q1–Q3.

Figure 5:
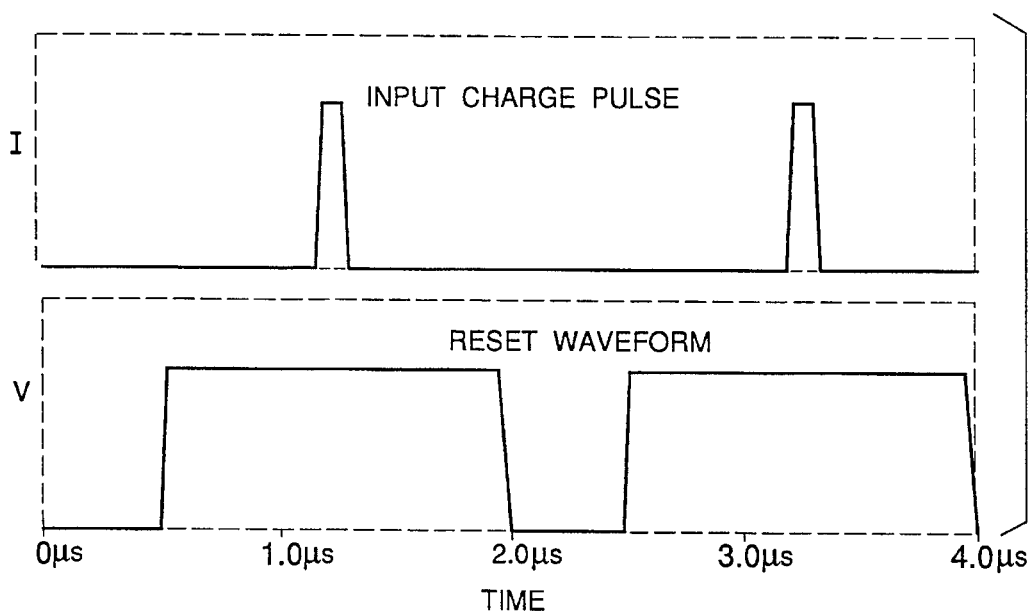

FIGS. 5 through 9 illustrate simulation results for the integration of a simulated laser pulse with the PD and CCTIA 10 of FIG. 3. FIG. 5 shows the reset signal (active low) and the timing of the laser signal event with respect to the reset signal. FIGS. 6 through 9 show the output waveform of the CTIA 10 of FIG. 3 for laser pulses producing PD output currents of 0.1 µA, 1.0 µA, 10 µA, and 30 µA, respectively. The laser pulse-induced input currents are assumed to have a rise time of 20 nS and a half height width of 100 nS. The top-most curve in each of FIGS. 6–9 is the CCTIA 10 output voltage waveform which is a function of the integrated compression characteristics for the four transimpedance feedback paths. Each of the three lower curves (A–C) show the voltage signal in the feedback paths associated with C2–C4. The effects of the compression circuitry becoming active are shown in the lower curves as each additional feedback path becomes active. As in the previous simulation the delay in onset in these signals is a function of the crossover points for the circuit output voltage and the surface potential of the feedback loop MOSFETs Q1–Q3.

Figure 6:
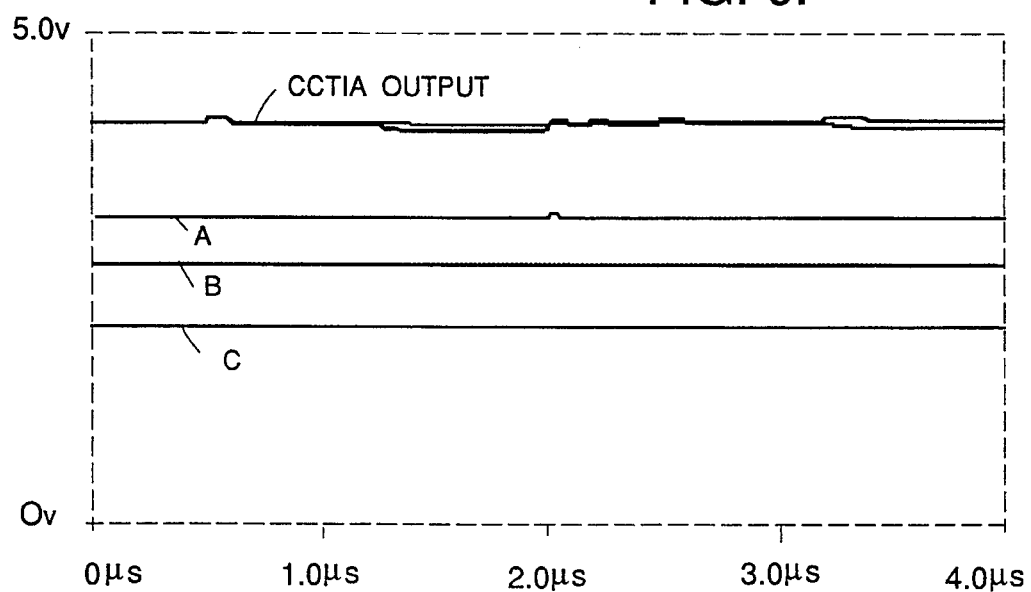
Figure 7:
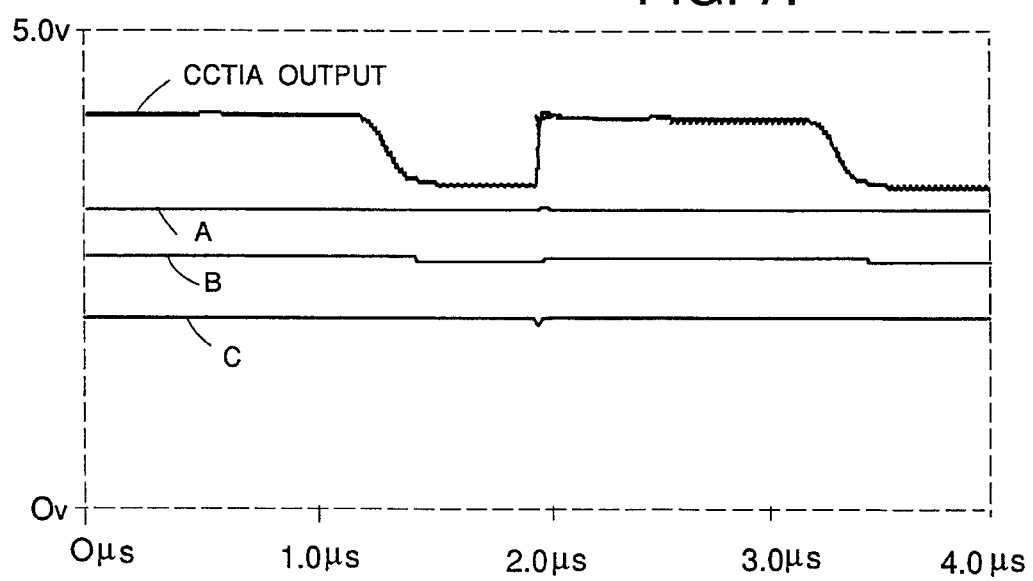
Figure 8:
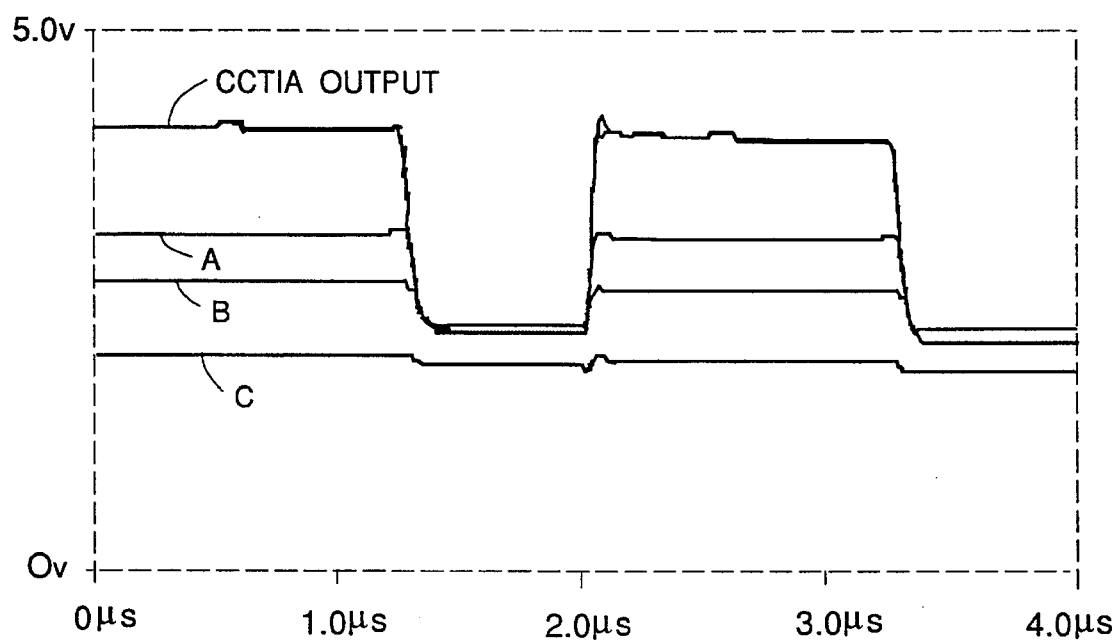
Figure 9:
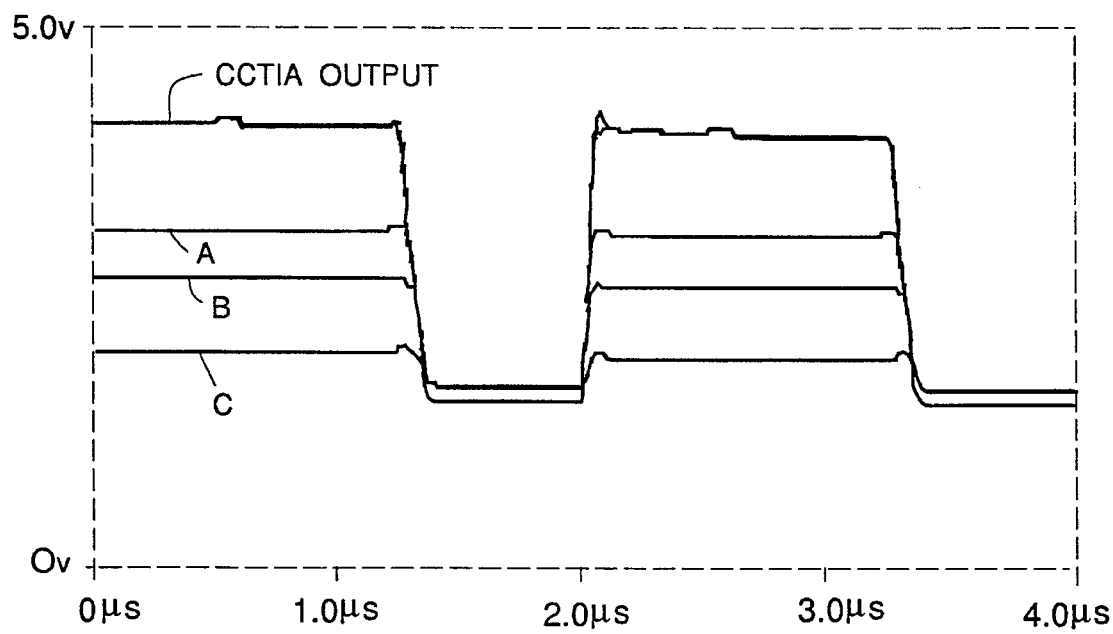

Contrasting FIGS. 6–9 it can be seen that, for the input currents corresponding to FIGS. 6 and 7, the CCTIA 10 output potential does not fall sufficiently to reach the potential set by V1. As such, the CCTIA 10 functions in a manner identical to a conventional CTIA, and the transimpedance is set only by C1. In FIG. 8 the input current is sufficiently large for the output voltage of the CCTIA 10 to pass the potentials set by both V1 and V2. In this case the transimpedance is set first by C1, then by the parallel combination of C1 and C2, and then by the parallel combination of C1, C2 and C3. In FIG. 9 the input current is larger still, and the output voltage of the CCTIA 10 passes the potentials set by V1, V2 and also V3. In this case the transimpedance is set first by C1, then by the parallel combination of C1 and C2, then by the parallel combination of C1, C2 and C3, and finally by the parallel combination of C1, C2, C3 and C4.

Although described in the context of two (FIG. 2) and three (FIG. 3) additional parallel feedback paths, it should be appreciated that the teaching of this invention applies equally to circuits constructed with from one to n additional feedback paths (in addition to the path comprising C1).

Furthermore, and although the CCTIA 10 of this invention has been described generally in the context of a laser energy detection system, a number of other similar or different applications can benefit from the teaching of this invention. By example only, the CCTIA 10 can be employed as a portion of a readout integrated circuit for converting the charge read out of a focal plane array (FPA) of cooled or un-cooled radiation detectors to corresponding voltages. Also, and although the invention has been described generally in the context of NMOS field effect transistors (FETs) and associated potentials, the use of PMOS FETs and associated potentials is also within the scope of this invention. Furthermore, other AMP embodiments (i.e., other than a cascode topology) can also be employed.

Thus, while the invention has been particularly shown and described with respect to exemplary embodiments thereof, it will be understood by those skilled in the art that changes in form and details may be made therein without departing from the scope and spirit of the invention.

What is claimed is:

1. A Compressing Capacitively Coupled Transimpedance Amplifier (CCTIA) circuit, comprising:

an amplifier having an input node for receiving a current signal and an output node for outputting a voltage signal;

a first feedback capacitance coupled between said input node and said output node, said first feedback capacitance having a value selected for setting a highest value of transimpedance for said CCTIA circuit;

first switch means coupled between said input node and said output node and in parallel with said first feedback capacitance, said first switch means being responsive to a reset signal being asserted for periodically connecting said input node to said output note, said output voltage of said amplifier assuming a first potential when said reset signal is asserted, said output voltage of said amplifier driving towards a second potential when said reset signal is not asserted; and at least one additional feedback capacitance that is switchably coupled in parallel with said first feedback capacitance by second switch means that is connected in series with said at least one additional feedback capacitance between said output node and said input node, said second switch means being comprised of a Field effect transistor (FET) having a source terminal coupled to a first terminal of said at least one additional capacitance, a drain terminal coupled to said output node, and a gate terminal coupled to a predetermined voltage potential intermediate said first and second potentials, wherein an open/closed state of said second switch means is a function of said voltage signal output from said output node.

2. A Compressing Capacitively Coupled Transimpedance Amplifier (CCTIA) circuit, comprising:

an amplifier having an input node for receiving a current signal and an output node for outputting a voltage signal;

a first feedback capacitance coupled between said input node and said output node, said first feedback capacitance having a value selected for setting a highest value of transimpedance for said CCTIA circuit;

first switch means coupled between said input node and said output node and in parallel with said first feedback capacitance, said first switch means being responsive to a reset signal being asserted for periodically connecting said input node to said output node;

at least one additional feedback capacitance that is switchably coupled in parallel with said first feedback capacitance by second switch means that is connected in series with said at least one additional feedback capacitance between said output node and said input node, said second switch means being comprised of a Field effect transistor (FET) having a source terminal coupled to a first terminal of said at least one additional capacitance, a drain terminal coupled to said output node, and a gate terminal coupled to a predetermined voltage potential, wherein an open/closed state of said second switch means is a function of said voltage signal output from said output node; and current source means coupled to said source terminal.

3. A Compressing Capacitively Coupled Transimpedance Amplifier (CCTIA) circuit comprising:

an inverting amplifier having a cascode configuration, an input node for receiving a current signal and an output node for outputting a voltage signal;

a first feedback capacitance coupled between said input node and said output node, said first feedback capacitance having a value selected for setting a highest value of transimpedance for said CCTIA circuit;

first switch means coupled between said input node and said output node and in parallel with said first feedback capacitance, said first switch means being responsive to a reset signal being asserted for periodically connecting said input node to said output node; and at least one additional feedback capacitance that is switchably coupled in parallel with said first feedback capacitance by second switch means that is connected in series with said at least one additional feedback capacitance between said output node and said input node, wherein an open/closed state of said second switch means is a function of said voltage signal output from said output node.

\* \* \* \* \*